(12) United States Patent
Nishioka

(10) Patent No.: US 7,835,206 B2
(45) Date of Patent: Nov. 16, 2010

(54) SEMICONDUCTOR MEMORY DEVICE CAPABLE OF RELIEVING DEFECTIVE BITS FOUND AFTER PACKAGING

(75) Inventor: Naohisa Nishioka, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 350 days.

(21) Appl. No.: 11/900,579

(22) Filed: Sep. 12, 2007

(65) Prior Publication Data
US 2008/0068918 A1    Mar. 20, 2008

(30) Foreign Application Priority Data
Sep. 14, 2006    (JP)  ............................... 2006-248821

(51) Int. Cl.
*G11C 29/04* (2006.01)
*G11C 8/12* (2006.01)

(52) U.S. Cl. .................. 365/200; 365/230.03; 714/710; 714/711

(58) Field of Classification Search ................. 365/200, 365/230.03; 714/710, 711
See application file for complete search history.

(56) References Cited

U.S. PATENT DOCUMENTS 6,055,196 A    4/2000    Takai
2002/0141264 A1*   10/2002   Mori et al. .................. 365/201

FOREIGN PATENT DOCUMENTS

| JP | 10-334690 | 12/1998 |
| JP | 2004-158069 | 6/2004 |
| JP | 2006-108394 | 4/2006 |

* cited by examiner

*Primary Examiner*—J. H. Hur
(74) *Attorney, Agent, or Firm*—Scully, Scott, Murphy & Presser, P.C.

(57) ABSTRACT

A semiconductor memory device includes plural banks, defect relief circuits individually provided for these banks, a defective-address storing circuit that stores defective addresses, and a comparing circuit that compares an access-requested address with a defective address. The defective-address storing circuit and the comparing circuit are allocated in common to two banks, respectively. With this arrangement, a chip area can be decreased.

10 Claims, 8 Drawing Sheets

SEMICONDUCTOR MEMORY DEVICE CAPABLE OF RELIEVING DEFECTIVE BITS FOUND AFTER PACKAGING

TECHNICAL FIELD

The present invention relates to a semiconductor memory device, and, more particularly relates to a semiconductor memory device capable of relieving a small number of defective bits found after packaging.

BACKGROUND OF THE INVENTION

While the storage capacity of a semiconductor memory device as represented by a DRAM (Dynamic Random Access Memory) increases year after year along the progress of microfabrication techniques, the number of defective memory cells included per one chip also increases as miniaturization is proceeded. These defective memory cells are usually replaced by redundant memory cells, thereby relieving defective addresses.

In general, defective addresses are stored in a fuse circuit which includes plural program fuses. When an access to the defective addresses is requested, the fuse circuit controls to carry out a replacement access to not the defective memory cells but the redundant memory cells. These defective addresses are detected in a selection test carried out in a wafer state. The defective addresses are stored in the program fuses by irradiating a laser beam.

However, even after the addresses are replaced, defective bits are sometimes sporadically found due to heat stress during the packaging. When the defective bits are found after the packaging, the addresses cannot be replaced any more by irradiating a laser beam. Therefore, the chip needs to be handled as a defective product.

To solve the above problem, there has been proposed a method of providing a defect relief circuit capable of relieving a small number of defective bits that are found after the packaging, in addition to the address replacement by irradiating a laser beam. In this case, as a circuit which stores the defective addresses, an electrically writable nonvolatile memory circuit is used, instead of the fuse circuit which requires the irradiation of a laser beam. For this memory circuit, what is called an "antifuse circuit" using dielectric breakdown of an oxide film can be used (see Japanese Patent Application Laid-open No. 2006-108394).

The number of defective bits found after the packaging is extremely smaller than the number of defective bits found in the selection test. Therefore, it is desirable to replace the defective bits in a bit unit, not in a word line unit or a bit line unit. Accordingly, when a memory cell array is divided into plural banks, for example, several defect relief circuits can be provided for each bank. In this case, a defective-address storing circuit that stores a defective address and a comparing circuit that compares an access-requested address with the defective address can be provided for each bank.

However, the defective-address storing circuit that stores the defective address has a relatively large occupied area on the chip. Therefore, when the defective-address storing circuit is allocated to each bank, the chip area increases. Further, as described above, the number of defective bits found after the packaging is very small, and therefore, defects are not found in most of the banks. Consequently, the method of allocating a defective-address storing circuit for each bank has a problem of having only a small advantage for the increase of area.

SUMMARY OF THE INVENTION

It is therefore an object of the present invention to provide a semiconductor memory device capable of correctly relieving defective bits found after the packaging, while suppressing the increase in the chip area.

The above and other objects of the present invention can be accomplished by a semiconductor memory device comprising:
a plurality of banks;
a plurality of defect relief circuits each provided associated one or more banks;
a plurality of defective-address storing circuits that stores defective addresses; and
a plurality of comparing circuits that compares access-requested addresses with the defective addresses,
wherein the defective-address storing circuits and the comparing circuits are allocated in common to two or more banks, and only one of the plurality of defect relief circuits corresponding to the two or more banks can be used.

In a preferred embodiment of the present invention, the defect relief circuits are provided separately from the memory cell arrays. It is desirable that the defect relief circuits have a circuit configuration different from that of the memory cells. For example, the defect relief circuits have a SRAM cell configuration, and the memory cells have a DRAM cell configuration.

In a preferred embodiment of the present invention, each defective-address storing circuit is an electrically writable nonvolatile memory circuit. It is desirable that each defective-address storing circuit is an antifuse circuit that can be irreversibly changed from the nonconductive state to the conductive state, by electrical writing operation.

In a preferred embodiment of the present invention, each of the comparing circuits includes a first X address comparing circuit that detects a coincidence of X addresses of a corresponding first bank, a second X address comparing circuit that detects a coincidence of X addresses of a corresponding second bank, a Y address comparing circuit that detects a coincidence of Y addresses of the first or the second bank, and an interrupt circuit that interrupts one of a coincidence signal from the first X address comparing circuit and a coincidence signal from the second X address comparing circuit, based on a bank to be relieved stored in the defective-address storing circuit.

According to the present invention, because the defective-address storing circuit and the comparing circuit are allocated in common to two or more banks, the chip area can be decreased. In this case, while the number of defective bits that can be relieved decreases, the number of defective bits that can be found after the packaging becomes very small, as described above. Because defects are not found in most of the banks, there are almost no practical troubles.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
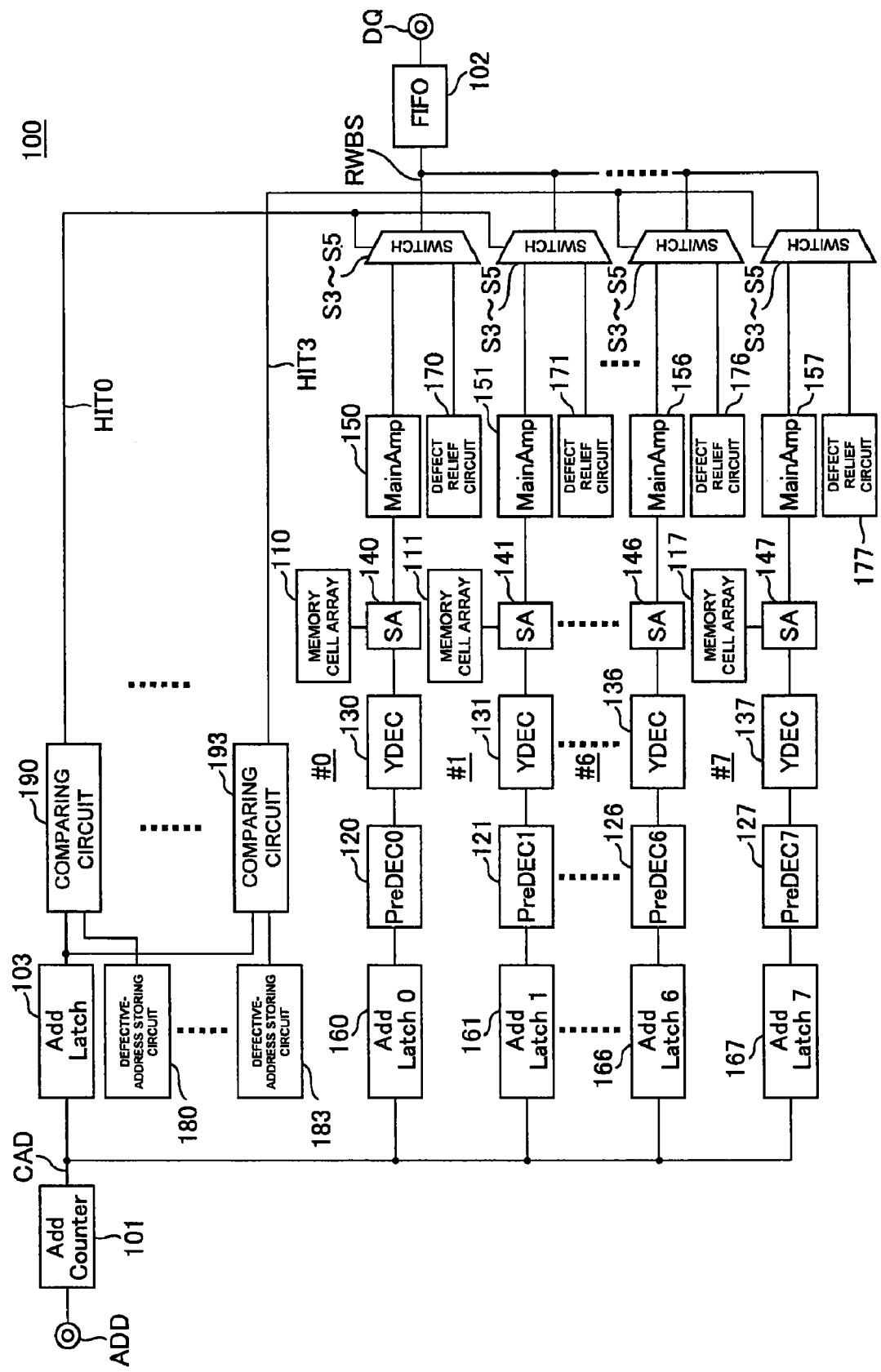
FIG. 1 is a block diagram showing main parts of a semiconductor memory device according to a first embodiment of the present invention.

FIG. 1 is a block diagram showing main parts of a semiconductor memory device 100 according to the first embodiment of the present invention. FIG. 1 indicates only column system circuits and data system circuits, and row system circuits are omitted.

Figure 2:
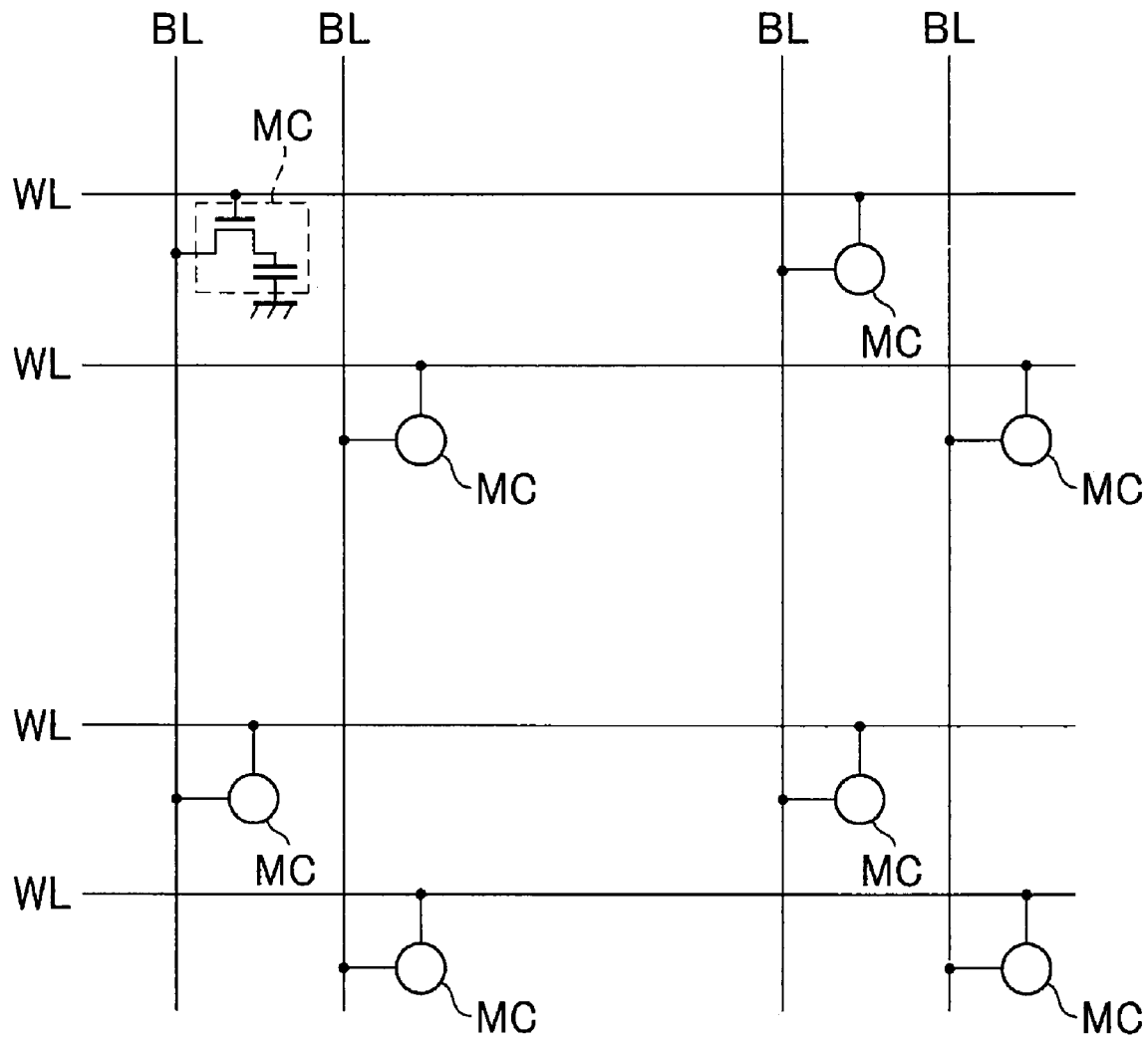
FIG. 2 is a schematic circuit diagram of a memory sell array shown in FIG. 1.

As shown in FIG. 1, the semiconductor memory device 100 according to the present embodiment is divided into eight banks #0 to #7. These banks include memory cell arrays 110 to 117, predecoders 120 to 127, Y decoders 130 to 137, and sense amplifiers 140 to 147, respectively. As shown in FIG. 2, each memory cell arrays 110 to 117 includes a plurality of word lines WLs, a plurality of bit lines BLs, and a plurality of memory cells MCs disposed at intersections between the word lines and the bit lines. Each memory cell MC has a DRAM cell configuration. Each memory cell arrays 110 to 117 includes redundant circuits to replace addresses in a selection test carried out in a wafer state, but are not direct relevant to the gist of the present invention, and therefore, are omitted in the drawing.

To access a predetermined memory cell MC, a column address CAD is supplied to the predecoders 120 to 127 via an address counter 101 and corresponding address latch circuits 160 to 167. With this arrangement, the corresponding Y decoders 130 to 137 select the predetermined sense amplifiers 140 to 147, so that the selected sense amplifiers 140 to 147 are connected to main amplifiers 150 to 157. The main amplifiers 150 to 157 are provided between the corresponding banks #0 to #7 and a read-write bus RWBS, and include read amplifiers and write amplifiers, as described later. The main amplifiers 150 to 157 are connected to a FIFO 102, and the FIFO 102 inputs and outputs data via a data input/output terminal DQ.

As shown in FIG. 1, the semiconductor memory device 100 according to the present embodiment includes defect relief circuits 170 to 177 in the banks #0 to #7, respectively. The defect relief circuits 170 to 177 are provided corresponding to the main amplifiers 150 to 157, and are used to relieve defective bits found after the packaging.

Figure 3:
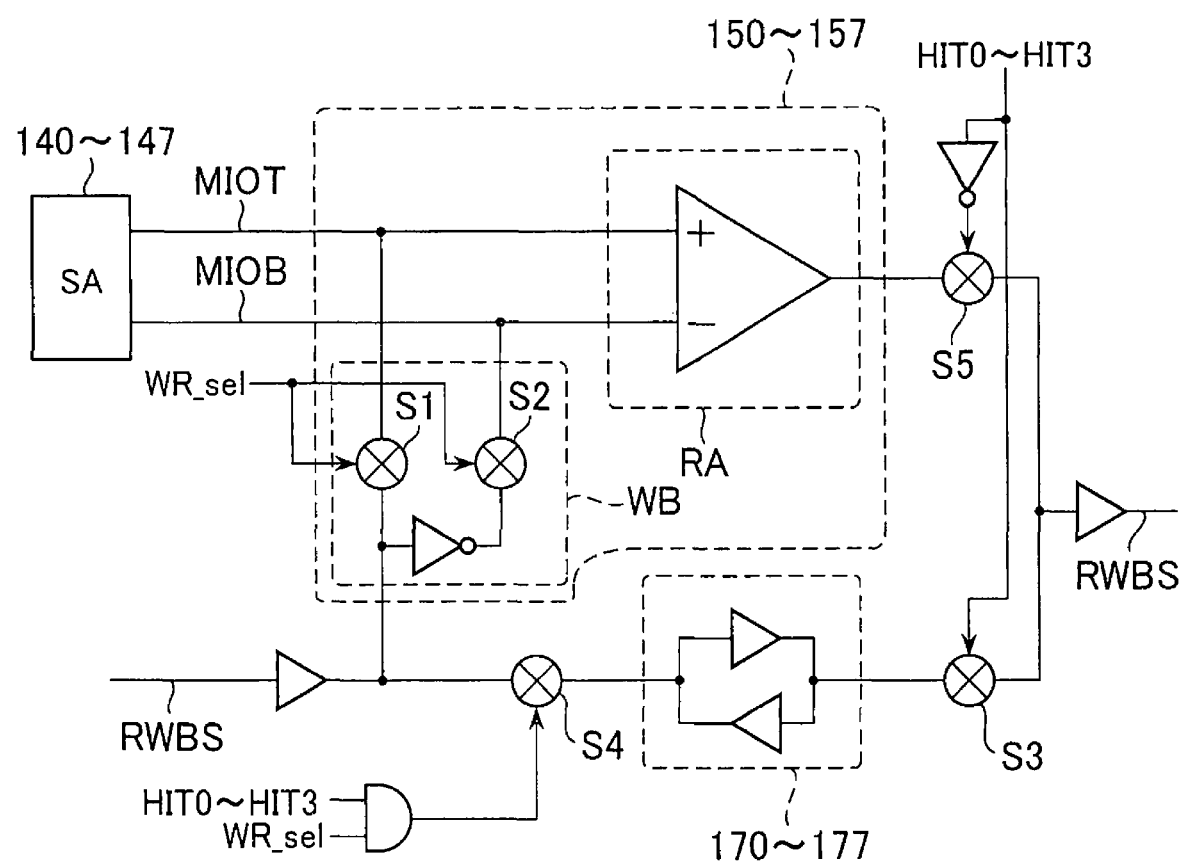
FIG. 3 is a circuit diagram of main amplifier and a defect relief circuit.

FIG. 3 is a circuit diagram of the main amplifiers 150 to 157 and the defect relief circuits 170 to 177.

As shown in FIG. 3, the main amplifiers 150 to 157 include a read amplifier RA that converts complementary signals appearing in a pair of main IO lines MIOT and MIOB into a high-level or low-level single signal, and supplies the single signal to the read-write bus RWBS, and a write buffer WB that supplies the single signal appearing in the read-write bus RWBS to the pair of main IO lines MIOT and MIOB, in the format of complementary signals. The write buffer WB includes switches S1 and S2. The switches S1 and S2 bring into on state when a write signal WR_sel is activated.

The defect relief circuits 170 to 177 include flip-flop circuits, that is, an SRAM cell configuration. As explained above, the defect relief circuits 170 to 177 are types of memory elements different from memory cells MCs included in the memory cell arrays 110 to 117. Unlike the redundant circuits that replace addresses in the selection test, the defect relief circuits 170 to 177 relieve a small number of bit defects found after the packaging.

The defect relief circuits 170 to 177 are connected to the read-write bus RWBS via switches S3 and S4. The switch S3 brings into on state when the corresponding hit signals HIT0 to HIT3 are activated. The switch S4 brings into on state when both the corresponding hit signals HIT0 to HIT3 and the write signal WR_sel are activated. A switch S5 brings into on state when the corresponding hit signals HIT0 to HIT3 are inactivated. The hit signal HIT0 is used for the banks #0 and #1, the hit signal HIT1 is used for the banks #2 and #3, the hit signal HIT2 is used for the banks #4 and #5, and the hit signal HIT3 is used for the banks #6 and #7. Comparing circuits described later generate these hit signals HIT0 to HIT3. These hit signals HIT0 to HIT3 bring into active state when addresses to be replaced are supplied.

Referring back to FIG. 1, the semiconductor memory device 100 according to the present embodiment includes defective-address storing circuits 180 to 183 that store defective addresses, and comparing circuits 190 to 193 that compare access-requested addresses with defective addresses. While the semiconductor memory device 100 according to the present embodiment includes eight banks, only the four defective-address storing circuits 180 to 183 and the four comparing circuits 190 to 193 are provided.

Specifically, the defective-address storing circuit 180 and the comparing circuit 190 are allocated in common to the banks #0 and #1, the defective-address storing circuit 181 and the comparing circuit 191 are allocated in common to the banks #2 and #3, the defective-address storing circuit 182 and the comparing circuit 192 are allocated in common to the banks #4 and #5, and the defective-address storing circuit 183 and the comparing circuit 193 are allocated in common to the banks #6 and #7.

Figure 8:
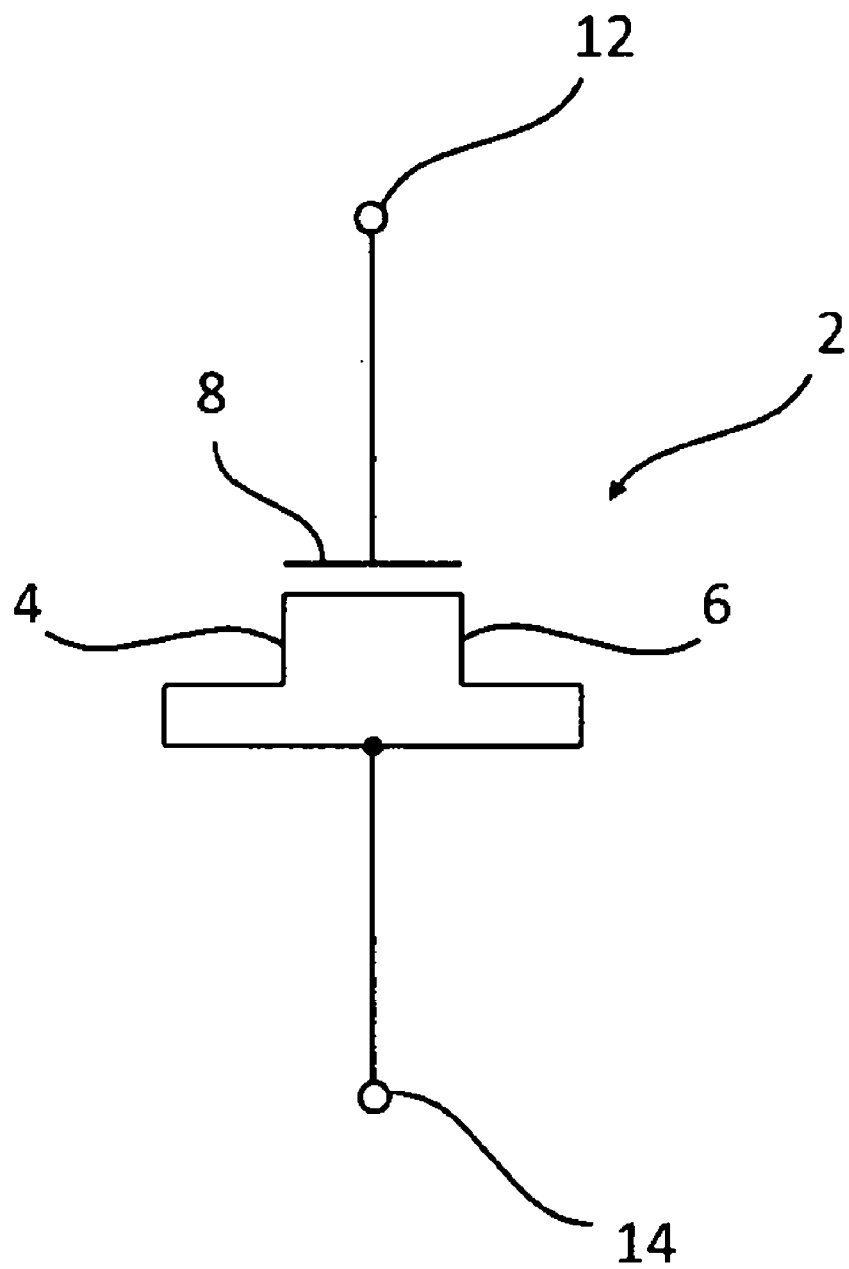
FIG. 8 is a circuit diagram of an antifuse circuit.

Although it is not particularly limited, the defective-address storing circuits 180 to 183 include antifuse circuits. As shown in FIG. 8, each of the antifuse circuits includes MOS transistor 2 of depression type whose source 4 and drain 6 are short circuited. In an initial state the resistance between the node 12 connected to the gate electrode 8 and the node 14 connected in common to the source 4 and drain 6 is very high because they are isolated by the gate oxide film. The antifuse circuits can be irreversibly changed from the nonconductive state to the conductive state by applying a breakdown voltage between the nodes 12 and 14 so as to break the gate oxide film. Once the gate oxide film is broken, the resistance between the nodes 12 and 14 becomes low.

Figure 4A:
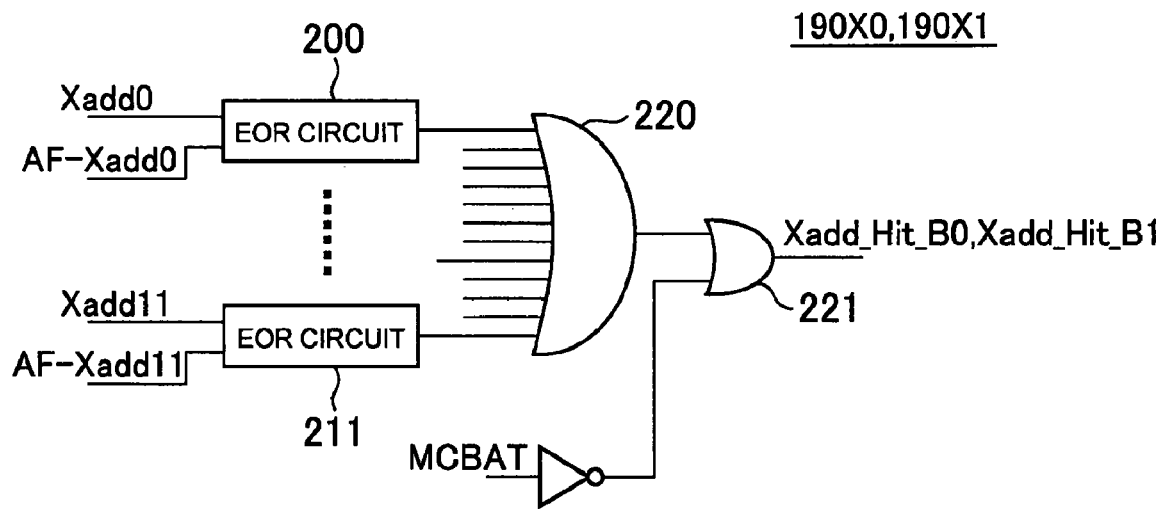
FIG. 4A is a circuit diagram of an X address comparing circuit included in a comparing circuit shown in FIG. 1.
Figure 4B:
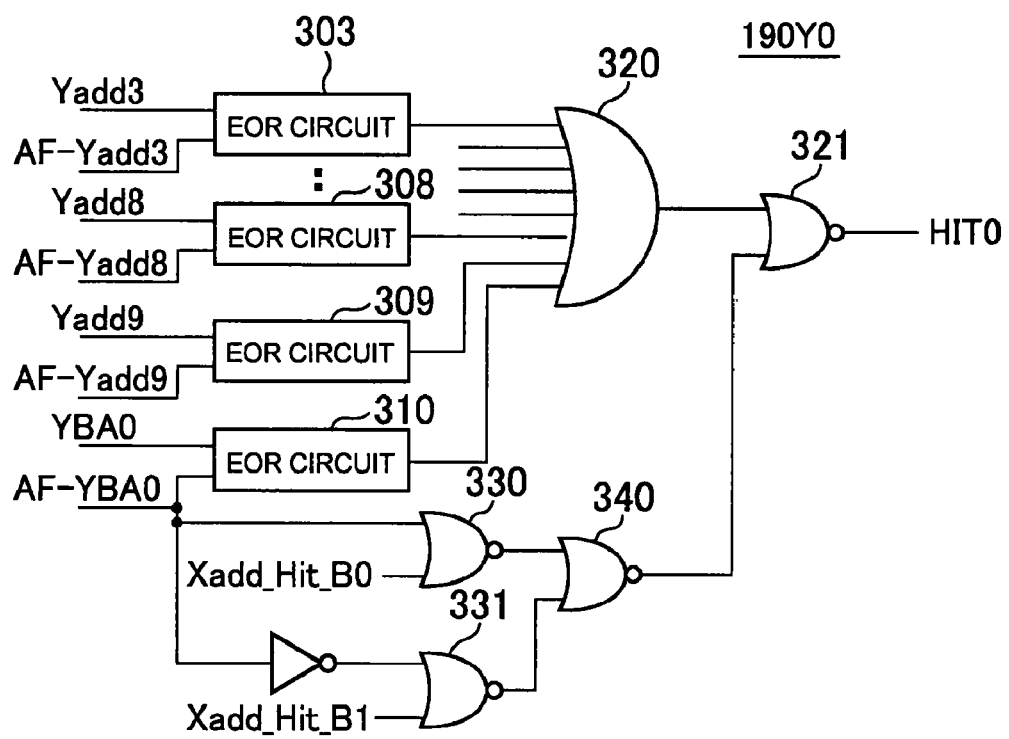
FIG. 4B is a circuit diagram of a Y address comparing circuit included in the comparing circuit.

FIGS. 4A and 4B are circuit diagrams of the comparing circuit 190. FIG. 4A depicts an X address comparing circuit, and FIG. 4B depicts a Y address comparing circuit.

The comparing circuit 190 includes two X address comparing units 190X0 and 190X1, and a Y address comparing unit 190Y0. The X address comparing units 190X0 and 190X1 are circuits corresponding to the banks #0 and #1, respectively, and detect X addresses of defective bits to be relieved. On the other hand, the Y address comparing unit 190Y0 is a circuit corresponding to both the banks #0 and #1, and detects Y addresses of defective bits to be relieved.

As shown in FIG. 4A, the X address comparing units 190X0 and 190X1 include plural exclusive OR (EOR) circuits 200 to 211 that detect a coincidence between X addresses Xadd0 to Xadd11 and output values AF-Xadd0 to AF-Xadd11 of the corresponding defective-address storing circuit 180, an OR circuit 220 that receives outputs of these EOR circuits 200 to 211, and an OR circuit 221 that receives an output of the OR circuit 220 and an inverted signal of a bank active signal MCBAT. The output of the OR circuit 221 is used as X address coincidence signals Xadd_Hit_B0 or Xadd_Hit_B1. Based on the above circuit configuration, when all the X addresses Xadd0 to Xadd11 coincide with the output values AF-Xadd0 to AF-Xadd11 of the corresponding defective-address storing circuit 180, the corresponding X address coincidence signal Xadd_Hit_B0 or Xadd_Hit_B1 becomes the low level (the active level). In other cases, the X address coincidence signals Xadd_Hit_B0 and Xadd_Hit_B1 are maintained at the high level (the inactive level).

On the other hand, as shown in FIG. 4B, the Y address comparing unit 190Y0 includes plural exclusive OR (EOR) circuits 303 to 310 that detect a coincidence of Y addresses Yadd3 to Yadd9 and a band address YBA0 with output values AF-Yadd3 to AF-Yadd9 and AF-YBA0, an OR circuit 320 that receives outputs of these EOR circuits 303 to 310, and an NOR circuit 321 that receives an output of the OR circuit 320. The Y address comparing unit 190Y0 further includes an NOR circuit 330 that receives the output value AF-YBA0 of the defective-address storing circuit 180 corresponding to the bank address YBA0 and the X address coincidence signal Xadd_Hit_B0, an NOR circuit 331 that receives the inverted signal of AF-YBA0 and the X address coincidence signal Xadd_Hit_B1, and a BOR circuit 340 that receives outputs of these NOR circuits 330 and 331. The output of the NOR circuit 340 is supplied to the NOR circuit 321. The output of the NOR circuit 321 is used as the hit signal HIT0.

Other comparing circuits 191 to 193 also have circuit configurations similar to those of the comparing circuit 190 shown in FIGS. 4A and 4B.

Based on the above configurations, the comparing circuit 190 can be used for any one of the bank #0 and the bank #1. In other words, when the comparing circuit 190 is used for the bank #0, the output value AF-YBA0 of the defective-address storing circuit 180 corresponding to the bank address YBA0 becomes the low level (0). Therefore, the NOR circuit 330 that receives the X address coincidence signal Xadd_Hit_B0 becomes valid, and the logic of the X address coincidence signal Xadd_Hit_B1 is disregarded. In other words, in this case, the X address coincidence signal Xadd_Hit_B1 is interrupted by the NOR circuit 331. On the other hand, when the comparing circuit 190 is used for the bank #1, the output value AF-YBA0 becomes the high level (1). Therefore, the NOR circuit 331 that receives the X address coincidence signal Xadd_Hit_B1 becomes valid, and the logic of the X address coincidence signal Xadd_Hit_B0 is disregarded. In other words, in this case, the X address coincidence signal Xadd_Hit_B0 is interrupted by the NOR circuit 330.

Based on the above configurations, the comparing circuit 190 can be used for any one of the bank #0 and the bank #1. In other words, because different banks can simultaneously set different X addresses to the active state, addresses need to be compared individually for the X address coincidence signals Xadd_Hit_B0 and Xadd_Hit_B1. In this case, because the comparing circuit 190 is shared between the banks, a simple OR (AND because of the negative logic) of Xadd_Hit_B0 and Xadd_Hit_B1 makes it impossible to determine in which bank the X addresses coincide, resulting in malfunction.

However, according to the present embodiment, when the comparing circuit 190 is used for the bank #0, the output value AF-YBA0 of the defective-address storing circuit 180 corresponding to the bank address YBA0 becomes the low level (0). Therefore, the NOR circuit 330 that receives the X address coincidence signal Xadd_Hit_B0 becomes valid, and the logic of the X address coincidence signal Xadd_Hit_B1 is disregarded. On the other hand, when the comparing circuit 190 is used for the bank #1, the output value AF-YBA1 of the defective-address storing circuit 180 corresponding to the bank address YBA1 becomes the low level (0). Therefore, the NOR circuit 331 that receives the X address coincidence signal Xadd_Hit_B1 becomes valid, and the logic of the X address coincidence signal Xadd_Hit_B0 is disregarded.

Accordingly, it becomes possible to use only one of the plural relief circuits corresponding to the two banks to which the defective-address storing circuit and the comparing circuit are allocated in common. Consequently, the defective-address storing circuit and the comparing circuit can be shared correctly between the banks.

As described above, one of the defective-address storing circuits 180 to 183 and one of the comparing circuits 190 to 193 can be allocated to the two banks. The logic level of AF-YBA0 becomes firm when the power supply is on, and the logic level of the X address coincidence signal Xadd_Hit_B0 or Xadd_Hit_B1 becomes firm when the X addresses are compared. Because the output of the NOR circuit 340 is already firm when the Y addresses are compared, this part does not limit the generation timing of the hit signal HIT0.

As explained above, in the semiconductor memory device 100 according to the present embodiment, the defective-address storing circuit and the comparing circuit are allocated in common to two or more banks. Therefore, the chip area can be decreased. Further, because the bank is selected using the part including the NOR circuits 330, 331, and 340, the hit signals HIT0 to HIT3 can be generated at a high speed.

A second embodiment of the present invention is explained next.

Figure 5:
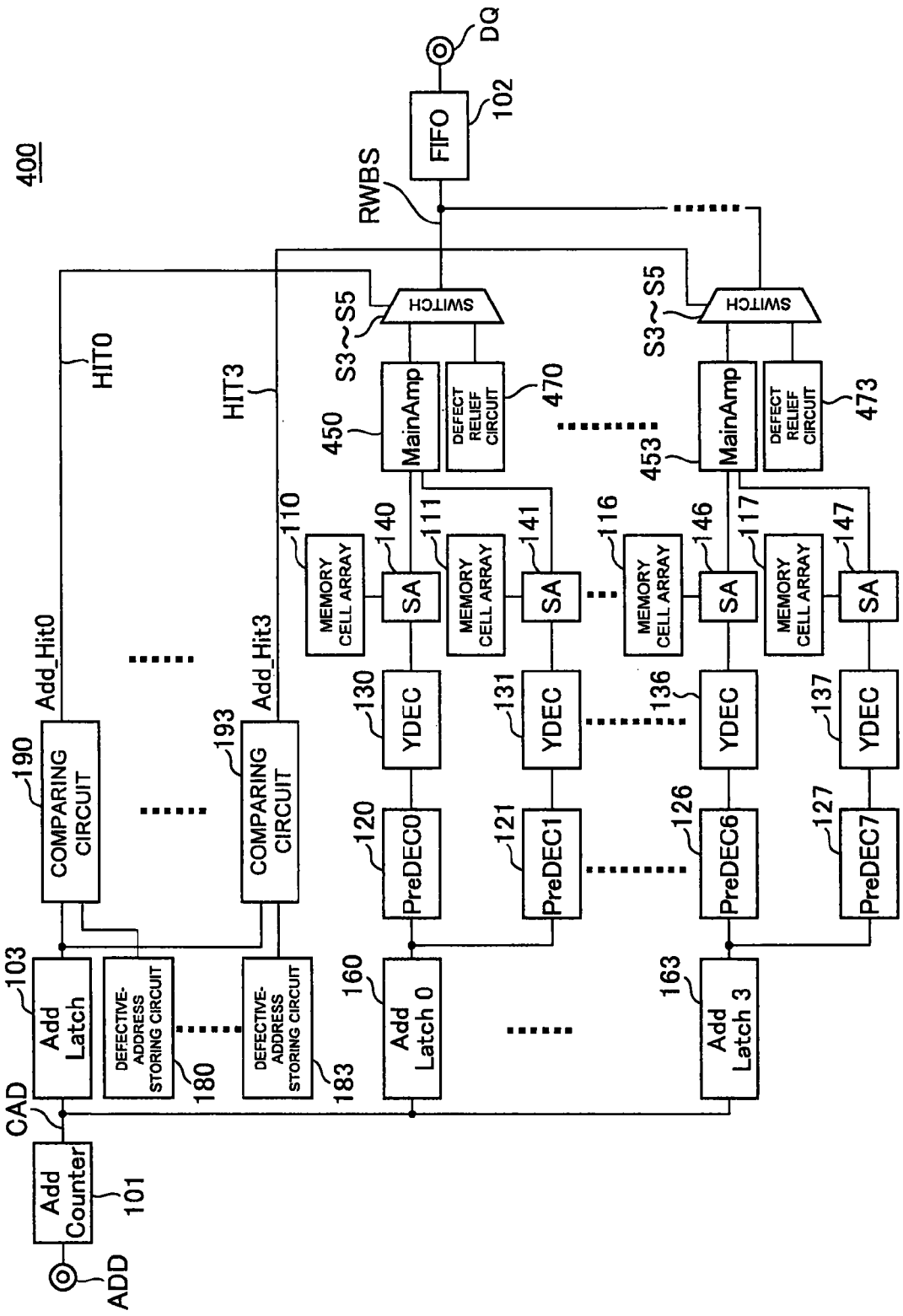
FIG. 5 is a block diagram showing main parts of a semiconductor memory device according to a second embodiment of the present invention.

FIG. 5 is a block diagram showing a configuration of main parts of a semiconductor memory device 400 according to the second embodiment. In FIG. 5, like constituent elements as those of the semiconductor memory device 100 according to the first embodiment are denoted with like reference numerals, and redundant explanations thereof will be omitted.

As shown in FIG. 5, in the semiconductor memory device 400 according to the present embodiment, a main amplifier is set in common to two banks to which a defective-address storing circuit and a comparing circuit are allocated in common. For example, one main amplifier 450 is used for the banks #0 and #1. Accordingly, the number of main amplifiers 450 to 453 is decreased to four, for eight banks. Following this arrangement, the number of defect relief circuits 470 to 473 is also decreased to four.

According to the present embodiment, in addition to the effects obtained from the above first embodiment, there is also the effect of a reduction in the chip area, because the numbers of the main amplifiers and the defect relief circuits can be decreased. Further, the fan-out of the hit signals HIT0 to HIT3 becomes small, thereby achieving generation of the hit signals at a higher speed.

A third embodiment of the present invention is explained next.

Figure 6:
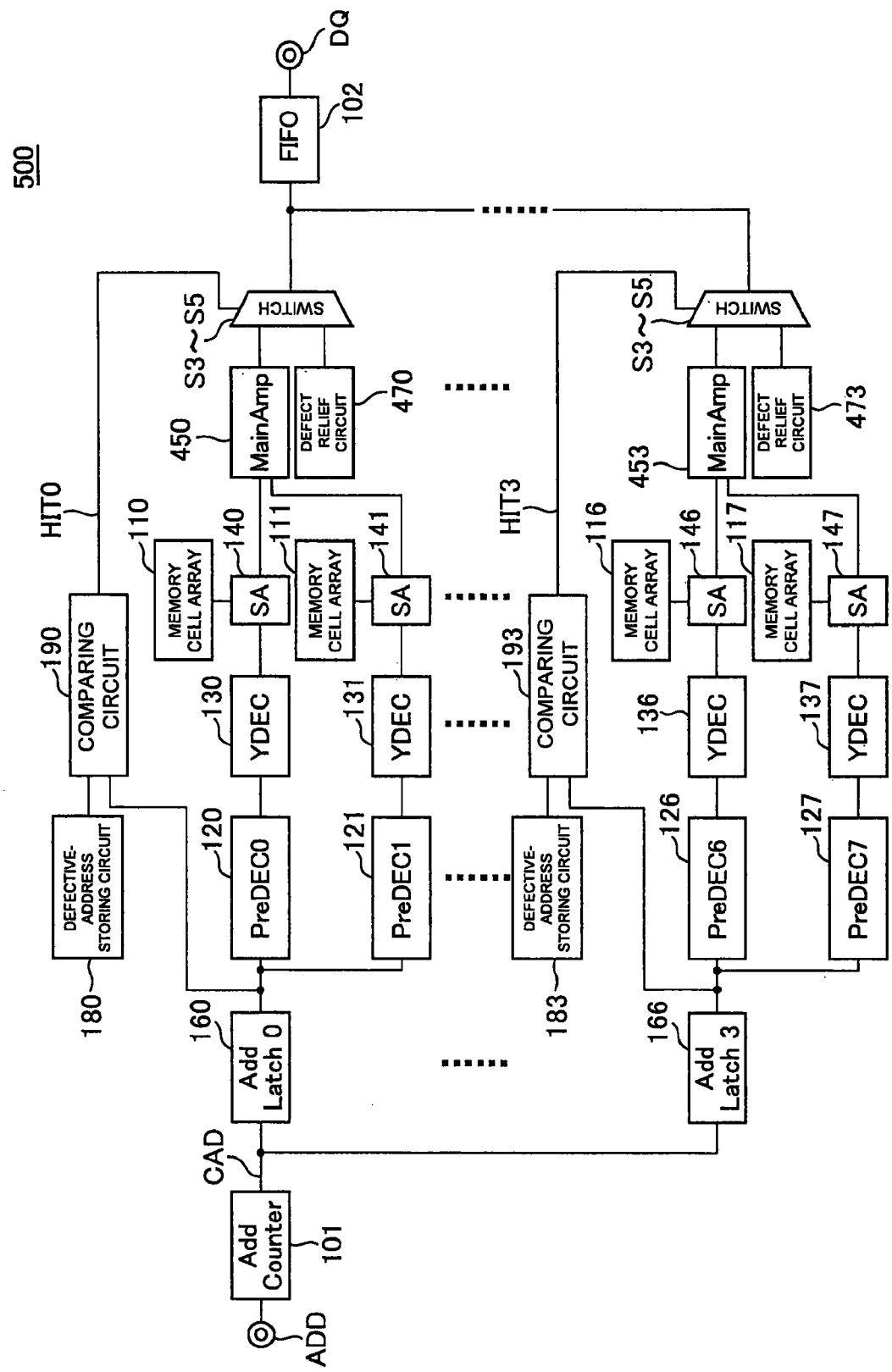
FIG. 6 is a block diagram showing main parts of a semiconductor memory device according to a third embodiment of the present invention.

FIG. 6 is a block diagram showing a configuration of main parts of a semiconductor memory device 500 according to the third embodiment. In FIG. 6, like constituent elements as those of the semiconductor memory devices 100 and 400 according to the first and second embodiment are denoted with like reference numerals, and redundant explanations thereof will be omitted.

As shown in FIG. 6, the semiconductor memory device 500 according to the present embodiment has a defective-address memory device and a comparing circuit disposed adjacently to corresponding two banks. With this arrangement, the address latch circuit 103 for the comparing circuit shown in FIG. 1 and FIG. 5 is omitted.

Figure 7:
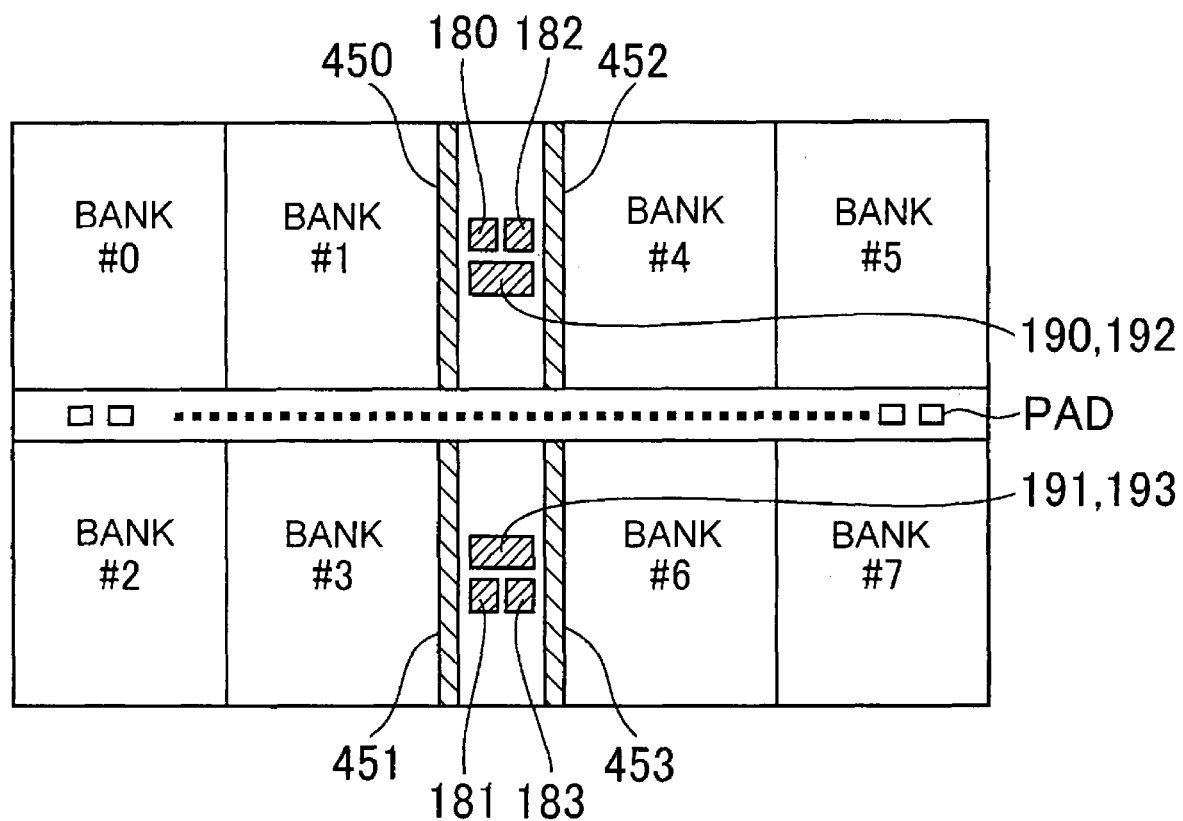
FIG. 7 is an explanatory diagram of the layout of the semiconductor memory device shown in FIG. 6.

FIG. 7 is an explanatory diagram of the layout of the semiconductor memory device 500 according to the present embodiment.

As shown in FIG. 7, the semiconductor memory device 500 according to the present embodiment has banks #0, #1, #4, #5 and banks #2, #3, #6, #7 disposed by sandwiching a row of pads PADs provided at the center. The main amplifiers 450 and 452 are disposed between the bank #1 and the bank #4, and the main amplifiers 451 and 453 are disposed between the bank #3 and the bank #6. Defective-address storing circuits 180 and 182 and comparing circuits 190 and 192 are disposed adjacently to the main amplifier 450 and the main amplifier 452, respectively, in the area sandwiched by these main amplifiers. Defective-address storing circuits 181 and 183 and comparing circuits 191 and 193 are disposed adjacently to the main amplifier 451 and the main amplifier 453, respectively, in the area sandwiched by these main amplifiers.

As explained above, when the defective-address storing circuits 180 to 183 and the comparing circuits 190 to 193 are disposed scatteringly near the corresponding memory banks, the lengths of the address wiring and the wiring of the hit signals HIT0 to HIT3 can be shortened very much. Accordingly, the hit signals can be generated at a higher speed.

The present invention is in no way limited to the aforementioned embodiments, but rather various modifications are possible within the scope of the invention as recited in the claims, and naturally these modifications are included within the scope of the invention.

While the application of the present invention to the DRAM has been explained in the above embodiments as an example, the application of the present invention is not limited thereto. The invention can be also applied to other kinds of semiconductor memory devices, and can be also applied to a semiconductor device mounted integrally with a processor and a memory.

What is claimed is:

1. A semiconductor memory device comprising:
   a plurality of banks, each of said plurality of banks including a plurality of word lines, a plurality of bit lines, and a plurality of memory cells disposed at intersections of the plurality of word lines and the plurality of bit lines;
   a plurality of defect relief circuits that relieve defective bits included in the plurality of memory cells, each assigned to an associated one of a plurality of main amplifiers that access the memory cells;
   a plurality of defective-address storing circuits that store defective addresses, each assigned to an associated one or more of the plurality of defect relief circuits;
   a plurality of comparing circuits, each assigned to an associated one or more of the plurality of defect relief circuits; and
   a switch that connects either the plurality of defect relief circuits or the plurality of main amplifiers to a data input/output terminal based on an output signal of the plurality of comparing circuits,
   wherein each one of the plurality of comparing circuits includes:
   an X address comparing block that compares a first X address to be accessed with a second X address stored in the defective-address storing circuits, said X address comparing block being assigned to an associated one of the plurality of banks;
   a Y address comparing block that compares a first Y address and a first bank address to be accessed with a second Y address and a second bank address stored in the defective-address storing circuits, the Y address comparing block being assigned to an associated more than one of the plurality of banks;
   a selection block that selects output signals of the X address comparing block based on the bank address stored in the defective-address storing circuits; and
   a logic block that compares an output signal of the selection block with an output signal of the Y address comparing block.

2. The semiconductor memory device as claimed in claim 1, wherein the switch includes:
   a first switch controlled by the output signal of the plurality of comparing circuits, the first switch being connected between the data input/output terminal and a read amplifier that reads data from the plurality of memory cells;
   a second switch controlled by the output signal of the plurality of comparing circuits, the second switch being connected between the data input/output terminal and the plurality of defect relief circuits; and
   a third switch controlled by the output signal of the plurality of comparing circuits and a write signal, the third switch being connected between the data input/output terminal and the plurality of defect relief circuits.

3. The semiconductor memory device as claimed in claim 1, wherein the X address comparing block includes:
   a comparing block that compares the first X address to be accessed with the second X address stored in the defective-address storing circuits; and
   a first logic block that controls an output signal of the comparing block based on a bank active signal.

4. The semiconductor memory device as claimed in claim 3, wherein the Y address comparing block includes:
   a first comparing block that compares the first Y address to be accessed with the second Y address stored in the defective-address storing circuits;
   a second comparing block that compares the first bank address to be accessed and the second bank address stored in the defective-address storing circuits; and
   a second logic block that logically synthesizes output signals of the first and second comparing blocks.

5. The semiconductor memory device as claimed in claim 1, wherein the plurality of defect relief circuits have flip-flop circuit configuration, and the plurality of memory cells have a DRAM cell configuration.

6. The semiconductor memory device as claimed in claim 5, wherein each of the plurality of defective-address storing circuits is an antifuse circuit that can be irreversibly changed from a nonconductive state to a conductive state, by an electrical writing operation.

7. The semiconductor memory device as claimed in claim 1,
   wherein each of the plurality of comparing circuits interrupts a first coincidence signal from the X address comparing circuit based on the bank address stored in the defective-address storing circuit, and
   wherein each of the plurality of comparing circuits further includes a synthesizing circuit that logically synthesizes a second coincidence signal from the X address comparing circuit that is not interrupted and a third coincidence signal from the Y address comparing circuit.

8. The semiconductor memory device as claimed in claim 1, wherein each of the plurality of main amplifiers is connected between more than one bank and the data input/output terminal, the plurality of defect relief circuits is assigned to an associated one of the plurality of main amplifiers, and each of the plurality of main amplifiers and each of the plurality of defect relief circuits are assigned to more than one banks that are assigned to a same defective-address storing circuit and a same comparing circuit.

9. The semiconductor memory device as claimed in claim 8, wherein the plurality of defective-address storing circuits and the plurality of comparing circuits are disposed adjacent to a corresponding main amplifier.

10. The semiconductor memory device as claimed in claim 1, wherein two or more of the plurality of banks can be brought into an active state.

* * * * *